United States Patent [19]

Akiba et al.

[11] Patent Number: 4,773,075
[45] Date of Patent: Sep. 20, 1988

[54] LIGHT EMITTING DEVICE

[75] Inventors: Shigeyuki Akiba, Tokyo; Katsuyuki Utaka, Musashino; Yukio Noda; Masatoshi Suzuki, both of Yokohama; all of Japan

[73] Assignee: Kukusai Denshin Denwa Kabushiki Kaisha, Tokyo, Japan

[21] Appl. No.: 893,484

[22] Filed: Aug. 5, 1986

[30] Foreign Application Priority Data

Aug. 7, 1985 [JP] Japan .................................. 60-172476

[51] Int. Cl.$^4$ ............................................. H01S 3/19
[52] U.S. Cl. ........................................ 372/50; 372/44; 369/122
[58] Field of Search ............... 369/122; 372/44, 50, 372/38, 96; 357/14

[56] References Cited

U.S. PATENT DOCUMENTS 3,040,262  6/1962  Pearson ................................. 357/14
3,941,945  3/1976  Borner et al. ....................... 369/122

Primary Examiner—William L. Sikes
Assistant Examiner—B. Randolph
Attorney, Agent, or Firm—Emmanuel J. Lobato; Robert E. Burns

[57] ABSTRACT

There is disclosed a light emitting device comprising at least a semiconductor laser and an optical modulating element for modulating the output light from the semiconductor laser. In accordance with the present invention, a capacitive element for suppressing noise of the semiconductor laser arising from reflected light is disposed in parallel relation to current injection terminals of the semiconductor laser.

11 Claims, 2 Drawing Sheets

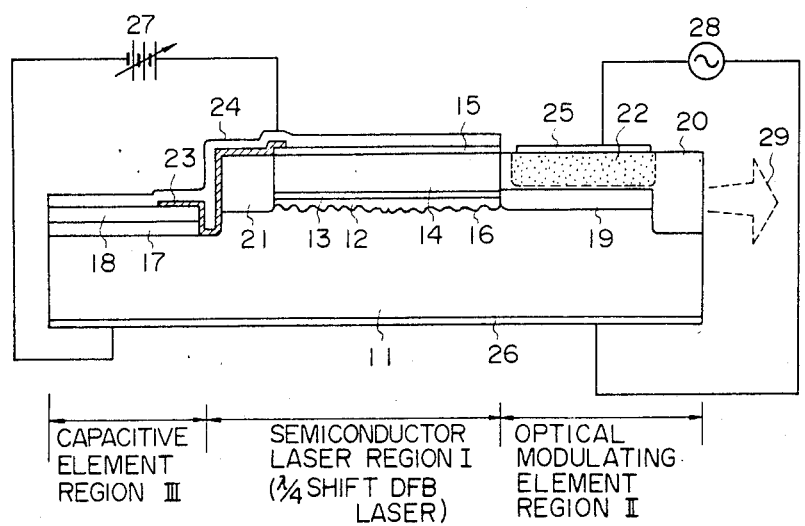
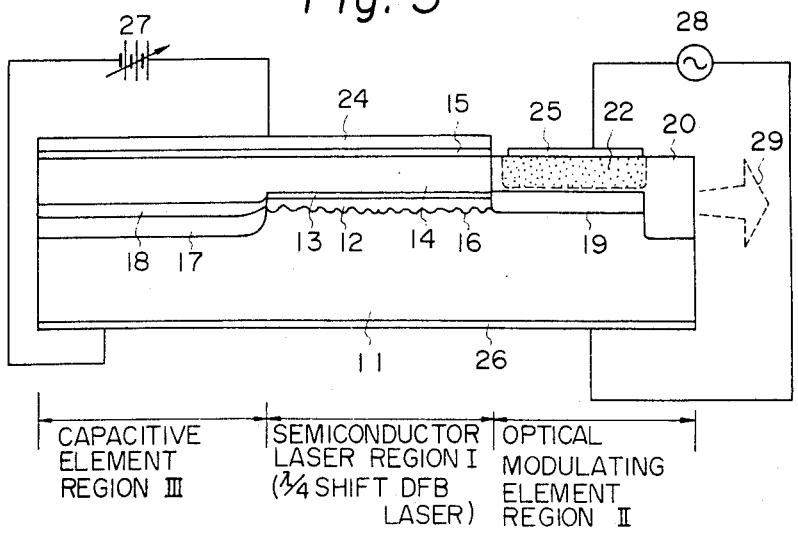

LIGHT EMITTING DEVICE

BACKGROUND OF THE INVENTION

The present invention relates to a light emitting device which employs a semiconductor laser as a light source, and more particularly to improvement of its noise characteristic.

Semiconductor lasers have now found use in a variety of applications such as an optical disc and an optical printer, not to speak of optical communications. Especially, they are playing an important part as a light source for optical fiber communication because their optical output can be directly modulated, with ease, at a rate of several hundred megabits per second or more by changing the values of their injection current. Since the semiconductor lasers are two-terminal elements, however, they are susceptible to the influence of reflected light; even 1% reflected light will produce large noise in their optical output. As the coherence of the output light improves, the influence of the reflected light becomes more marked, posing a serious problem in a single wavelength laser such as a distributed feedback (DFB) laser. Furthermore, in case of obtaining an oscillation line-width of a narrow modulation band by modulating the output of the single wavelength laser with an external optical modulating element, it is indispensable to take measures against noises which are caused by the reflected light. Accordingly, it is no exaggeration to say that noise-control measures in the light emitting device are of primary importance to the success of future optical transmission systems which employ an external optical modulating element, such as a high-speed optical transmission system of a transmission rate in excess of gigabits per second and a coherent optical transmission system.

A conventional remedy for noise attributable to reflected light is merely to minimize the reflection of light or alleviate the reflected light by means of an optical isolator. With this method, however, the introduction of the optical isolator impairs not only the overall reliability of the light emitting device but also the efficiency of optical coupling to an optical fiber or the like. Further, the reduction of the reflected light is also limited, and at the present technical level, reflected light of the order of 0.1 to 1% is unavoidable. Therefore, there is a strong demand for a light emitting device which is insusceptible to the influence of the reflected light.

SUMMARY OF THE INVENTION

The present invention is intended to obviate the above-mentioned defect of the prior art, and an object of the invention is to provide a light emitting device which is hard to be affected by reflected light, through use of a highly reliable element which would not cut down the optical coupling efficiency.

The feature of the present invention resides in that in a light emitting device comprised of at least a semiconductor laser and an optical modulating element, a capacitive element of excellent reliability is disposed in parallel relation to current injection terminals of the semiconductor laser.

Prior to a description of the arrangement of the light emitting device according to the present invention, a description will be given of the phenomenon that noise increases when reflected light is fed back to the semiconductor laser.

When the output light emitted from the semiconductor laser is coupled to an optical fiber, or when the output light is coupled therefrom to a photo detector, a portion of the incident light is reflected back into the semiconductor laser. The reflected light thus incident to the semiconductor laser causes an interaction with carriers in the semiconductor laser, giving rise to instability of the carrier density in the laser; this leads to instability of the optical output, generating noise therein.

The present inventors have studied means for suppressing the instability of the optical output arising from the reflected light incident to the semiconductor laser. Their studies have revealed that the purpose could be achieved by disposing, as means for absorbing fluctuations in the carrier density resulting from the reflected light, a capacitor or a reverse-biased semiconductor pn junction having a storage function (hereinafter referred to as a "capacitive element"), in parallel relation to the current injection electrodes of the semiconductor laser. With such an arrangement of the light emitting device, the instability of the carrier density in the laser by the reflected light can effectively be depressed by the capacitive element disposed in parallel relation to the current injection electrodes of the semiconductor laser. Thus, the instability of the optical output from the semiconductor laser is repressed, inhibiting noise generation.

Incidentally, the electrostatic capacity of the reverse-biased pn junction depends on the impurity concentration and the area of the pn junction; an increase in the impurity concentration or the area of the pn junction makes it also possible to increase the electrostatic capacity.

The present invention is based on such a principle as described above.

BRIEF DESCRIPTION OF THE DRAWINGS

The present invention will be described in detail below with reference to the accompanying drawings, in which:

FIGS. 2 and 3 are cross-sectional views illustrating embodiments of a monolithic light emitting device according to the present invention;

DETAILED DESCRIPTION

(EMBODIMENT 1)

Figure 1:
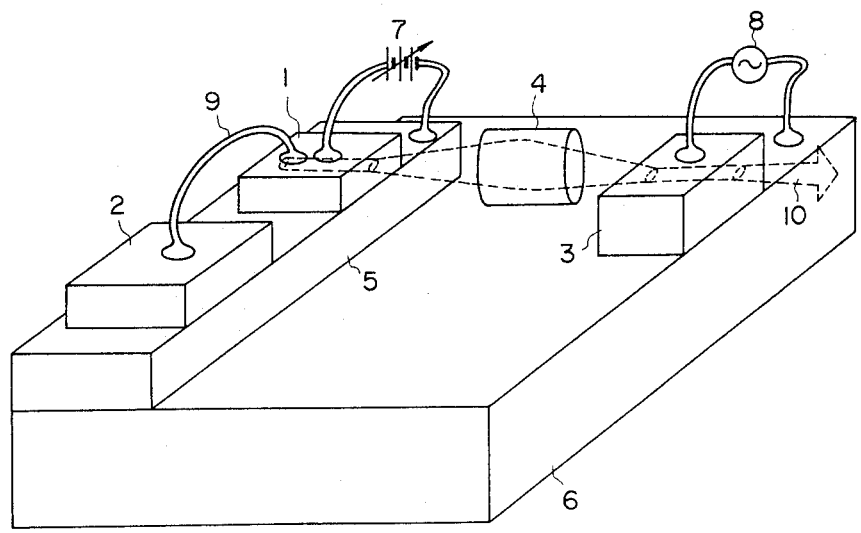
FIG. 1 is a perspective view illustrating an example of a hybrid light emitting device according to the present invention.

With reference to FIG. 1 illustrating a hybrid light emitting device embodying the present invention, a heat sink 5 and an optical modulating element 3 are mounted on a copper block 6 plated with gold. On the heat sink 5 there is disposed adjacent a semiconductor laser 1 a capacitive element 2 which is formed by a capacitor or semiconductor pn junction element and electrically connected in parallel to the semiconductor laser. The output light of the semiconductor laser 1 is coupled via a rod lens 4 to the optical modulating element 3. Reference numeral 7 indicates a DC power source of the semiconductor laser 1, 8 a modulating signal source, 9 a lead, and 10 modulated output light.

With such an arrangement, even if reflected light exists, noise is hard to occur in the output light from the semiconductor laser 1 on the basis of the afore-mentioned principle of the invention.

(EMBODIMENT 2)

FIG. 2 is a schematic cross-sectional view of a monolithic light emitting device, illustrating a second embodiment of the present invention. This is an example in which a quarter-wave shift distributed feedback semiconductor laser (a λ/4 shift DFB laser), an optical modulating element and a capacitive element are formed monolithically on an n-InP substrate 11.

First, the structure of the present invention will be described. A λ/4 shift DFB laser region I has a structure in which an n-InGaAsP waveguide layer 12, a nondoped InGaAsP active layer 13, a p-InP clad layer 14, and a p-InGaAsP cap layer 15 are formed and a quarter-wave shift diffraction grating 16 is formed at the boundary between a substrate 11 and the waveguide layer 12 so that a stable single-wave oscillation can be achieved at the Bragg wavelength. Reference numeral 21 designates a nondoped InP layer, which forms a window region.

An optical modulating element region II is comprised of a nondoped InGaAsP waveguide layer 19, a nondoped InP layer 20, and a zinc-diffused p-InP layer 22. The output light of the semiconductor laser is modulated by virtue of the electro-optic or Franz-Keldesh effect.

A capacitive element region III, which is the characteristic feature of the present invention, is formed by a pn junction element defined by a p-InP layer 17 and an n-InP layer 18 therebetween and is connected in parallel between current injection electrodes 24 and 26; the pn junction element has a large capacity because it is reverse-biased relative to a forward current to the semiconductor laser. Reference numeral 23 identifies an insulating film, 27 a DC power source for the laser, and 25 and 28 an electrode and a signal source for the optical modulating element, respectively.

In operation, even if a portion of the output light 29 from such a light emitting device is reflected by an external transmission system back into the active layer 13 of the semiconductor laser, since the electrodes of the semiconductor laser and the capacitive element are disposed in parallel relation, fluctuations in the carrier density in the active layer are suppressed as in case of the embodiment of FIG. 1, ensuring the prevention of the instability of the output light and the noise generation.

(EMBODIMENT 3)

FIG. 3 is a schematic cross-sectional view, illustrating a third embodiment of the present invention which is an improvement of the monolithic light emitting device depicted in FIG. 2.

As is evident from FIG. 3, the capacitive element is coupled directly with the semiconductor laser. That is, the reverse-biased pn junction is formed by the p-InP layer 17 and the n-InP layer 18 on an extension of the InGaAsP active layer 13 at one end of the semiconductor laser, and the p-InP layer 14 and the p-InGaAsP cap layer 15 of the semiconductor laser are laminated on the layer 18. Accordingly, the device of this embodiment can be fabricated with greater ease than in the case of the embodiment shown in FIG. 2. The other operations and functions of this embodiment are substantially the same as those of the FIG. 2 embodiment.

As described above, according to the present invention, noise components produced by reflected light are supplied to a capacitive element provided in parallel relation to electrodes of a semiconductor laser, so that this produces equivalently the same effect as would be obtainable by their absorption with the capacitive element, thus suppressing the generation of noise by reflected light. Moreover, the capacitive element need not be inserted in the optical propagation path unlike the optical isolator used in prior art, and hence does not affect at all the optical coupling efficiency.

Thus the present invention offers a light emitting device which is insusceptible to the influence of reflected light by employing, in place of the optical isolator a highly reliable capacitive element which would not impair the optical coupling efficiency. Accordingly, the invention is widely applicable to gigabit optical transmission, coherent optical transmission, and so forth, and hence is of great utility in practical use.

What we claim is:

1. A light emitting device comprising, a semiconductor laser having means comprising an active layer for developing a coherent light output along an optical path of light propagation, current injection terminals for injecting current carriers into the active layer, noise suppressing means disposed out of the optical path of light propagation and connected electrically in parallel to the current injection terminals of the semiconductor laser comprising means for absorbing fluctuations in carrier density resulting from reflected light for suppressing fluctuations in carrier density in the active layer due to output light reflected back into the active layer thereby preventing instability of the coherent light output and noise generation.

2. A light emitting device according to claim 1, in which said noise suppressing means disposed out of the optical path comprises capacitance means for storing electricity and electrically connected to the current injection terminals in parallel therewith.

3. A light emitting device according to claim 2, in which said capacitance means is a capacitor.

4. A light emitting device comprising, a semiconductor laser having means comprising an active layer and current injection terminals for developing a coherent light output along an optical path of light propagation, noise suppressing means disposed out of the optical path of light propagation and connected electrically in parallel to the current injection terminals of the semiconductor laser for suppressing fluctuations in carrier density in the active layer due to output light reflected back into the active layer thereby preventing instability of the coherent light output and noise generation, said noise suppressing means disposed out of the optical path comprising capacitance means for storing electricity and electrically connected to the current injection terminals in parallel therewith, and said capacitance means being a pn junction reverse-biased relative to forward current of the semiconductor laser.

5. A light emitting device according to claim 1, including light modulating means in said optical path.

6. A monolithic semiconductor light emitting device comprising, a DFB semiconductor laser having an active layer for developing a coherent light output along an optical path of light propagation, current injection terminals for injecting current carriers into the active layer, a noise suppression region integral with the semiconductor laser disposed out of said optical path and between the injection terminals electrically in parallel with said terminals effectively suppressing fluctuations in carrier density in the active layer thereby preventing instability of the coherent light output and noise generation due to output light reflected back into the active layer.

7. A monolithic semiconductor light emitting device comprising, a DFB semiconductor laser having means comprising an active layer and current injection terminals for developing a coherent light output along an optical path of light propagation, a noise suppression region integal with the semiconductor laser disposed out of said optical path and between the injection terminals electrically in parallel with said terminals effectively suppressing fluctuations in carrier density in the active layer thereby preventing instability of the coherent light output and noise generation due to output light reflected back into the active layer, and said noise suppression region comprising a capacitance region capable of storing electricity.

8. A monolithic semiconductor light emitting device comprising, a DFB semiconductor laser having means comprising an active layer and current injection terminals for developing a coherent light output along an optical path of light propagation, a noise suppression region integral with the semiconductor laser disposed out of said optical path and between the injection terminals electrically in parallel with said terminals effectively suppressing fluctuations in carrier density in the active layer thereby preventing instability of the coherent light output and noise generation due to output light reflected back into the active layer, said noise suppression region comprising a capacitance region capable of storing electricity, and said capacitance region comprising a pn junction reverse-biased relative to forward current of the semiconductor laser.

9. A monolithic semiconductor light emitting device according to claim 8, in which the reverse-biased pn junction is an extension of said active layer.

10. A monolithic semiconductor light emitting device according to claim 6, including an optical modulating region disposed in the optical path of coherent light ouput propagation.

11. A monolithic semiconductor light emitting device comprising, a substrate, a DFB semiconductor laser having an active layer on the substrate, a light modulating semiconductor region on said substrate in an optical path of light propagation of coherent light output of the DFB laser, and a noise suppression capacitive region on the substrate disposed out of said optical path of the coherent light output and connected electrically to the laser for effectively suppressing fluctuations in carrier density in the active layer due to coherent light output reflected back into the active layer.

* * * * *

UNITED STATES PATENT AND TRADEMARK OFFICE
CERTIFICATE OF CORRECTION

PATENT NO. : 4,773,075
DATED : Sep. 20, 1988
INVENTOR(S) : Akiba et al.

It is certified that error appears in the above-identified patent and that said Letters Patent is hereby corrected as shown below:

On the title page, left column, the name of the Assignee is corrected to read:

[73] Assignee: Kokusai Denshin Denwa Kabushiki Kaisha, Tokyo, Japan

Signed and Sealed this

Twentieth Day of March, 1990

Attest:

JEFFREY M. SAMUELS

Attesting Officer

Acting Commissioner of Patents and Trademarks